( 12 ) United States Patent
Kiryu et al.

(10) Patent No.: US 6,617,207 B1
(45) Date of Patent: Sep. 9, 2003

(54) METHOD AND SYSTEM FOR FORMING A STACKED GATE INSULATING FILM

(75) Inventors: Hideki Kiryu, Nirasaki (JP); Shintaro Aoyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/662,593

(22) Filed: Sep. 14, 2000

(30) Foreign Application Priority Data

Sep. 17, 1999 (JP) .......................................... 11-263548

(51) Int. Cl.⁷ ................. H01L 21/8242; H01L 21/8236; H01L 21/302; H01L 21/461
(52) U.S. Cl. ...................... 438/240; 438/278; 438/706; 438/756
(58) Field of Search ................................ 438/240, 278, 438/706, 756; 257/762, 774, 776

(56) References Cited

U.S. PATENT DOCUMENTS 5,672,521 A * 9/1997 Barsan et al. ................ 438/257
6,040,207 A * 3/2000 Gardner et al. .............. 438/216
6,255,166 B1 * 7/2001 Ogura et al. ................. 438/257

OTHER PUBLICATIONS

Stanley Wolf Ph.D. and Richard N. Tauber Ph.D. in Silicon Processing for the VLSI Era, vol. 1: Process Technology, Lattice Press, 1986, pp. 209–210, 531–534.*

Stanley Wolf Ph.D. and Richard N. Tauber Ph.D. in Silicon Processing for the VLSI Era, vol. 1: Process Technology, Lattice Press, 1986, pp. 539–541, 581–582.*

* cited by examiner

Primary Examiner—Olik Chaudhuri
Assistant Examiner—William M. Brewster
(74) Attorney, Agent, or Firm—Finnegan, Henderson, Farabow, Garrett & Dunner, LLP

(57) ABSTRACT

A stacked gate insulating film comprises a silicon oxide film and a tantalum oxide film which is stacked on the silicon oxide film and whose dielectric constant is higher than a dielectric constant of the silicon oxide film. The stacked gate insulating film is formed in accordance with the following steps. A semiconductor wafer is heated up, and the surface thereof is heat-oxidized. The silicon oxide film is formed on the semiconductor wafer (heat oxidation process). The silicon oxide film is etched back so as to be made thin (etch back process). The tantalum oxide film is stacked on the thin silicon oxide film (dielectric film formation process), thereby to form the stacked gate insulating film.

14 Claims, 8 Drawing Sheets

METHOD AND SYSTEM FOR FORMING A STACKED GATE INSULATING FILM

BACKGROUND OF THE INVENTION

1. Field of the Invention

The present invention relates to a method and system for forming a stacked gate insulating film, and more particularly, to a method and system for forming a stacked gate insulating film, wherein a dielectric film is stacked on a silicon oxide film.

2. Description of the Related Art

As semiconductor integrated circuits are more highly integrated and more miniaturized, MOSFETs (Metal Oxide Semiconductor Field Effect Transistor) are more miniaturized as well. FIG. 8 illustrates an exemplary diagram of a MOSFET.

As described in FIG. 8, in a MOSFET 101, a gate electrode 104 is formed on a semiconductor wafer 102 via a gate oxide film 103. On the surface of the semiconductor wafer 102, a source 105 and a drain 106 are formed, by two of which the gate oxide film 103 is sandwiched. By applying a voltage to the gate electrode 104, an inversion layer is formed on the surface of the semiconductor wafer 102 below the gate oxide film 103, and a channel 107 connecting the source 105 with the drain 106 is generated. In the MOSFET 101, the voltage to be applied to the gate electrode 104 is controlled, thereby the flow direction of carriers flowing to the drain 106 is controlled while the source 105 serves as a carrier source.

It is desired that the gate oxide film 103 employed in the gate area of the MOSFET 101 is to be made thin along with the miniaturization of the MOSFET 101. However, if the gate oxide film 103 is simply formed thin, a current flows to the gate oxide film 103.

An insulating film whose dielectric constant is higher than that of a silicon oxide film, such as a stacked gate insulating film including a silicon nitride film stacked on the stacked gate insulating film, may be employed for the purpose of decreasing the leakage current in the structure where the reduced thickness of an oxide film is made small while the physical thickness of the film increases. In this case, it is important that the silicon oxide film is maintained with high quality that the value of interface trap density is low, for example. If the quality of the silicon oxide film is deteriorated, the characteristics of the MOSFET are deteriorated in that a threshold value voltage shifts and the mutual conductance thereof is small.

Generally, a semiconductor wafer is heat-oxidized, thereby a silicon oxide film is formed on the surface of the semiconductor wafer. During the heat oxidation process, the semiconductor wafer including a silicon substrate is arranged in a heat treatment apparatus. Then, the semiconductor wafer is heated up to a high temperature of, for example, 850° C. by the heat treatment apparatus. After this, processing gas is conducted into the heat treatment apparatus so that the surface of the semiconductor wafer is heat-oxidized. As a result of this, the silicon oxide film having a predetermined thickness of, for example, 30 angstrom is formed on the semiconductor wafer.

However, in such a heat oxidation process carried out at a high temperature, the oxidation speed is quite fast, thus it is difficult to control the thickness of the silicon oxide film small like 10 angstrom or so. Therefore, the silicon oxide film is hardly made thin.

On the other hand, if the heat treatment is carried out at a lower temperature, the oxidation speed will be slower than the above case, and the silicon oxide film can be formed thin. However, in such a case, the quality of the silicon oxide film is deteriorated such that the interface trap density becomes high. If the quality of the silicon oxide film is low, some problems arise in that the threshold value voltage of to-be-formed transistors remarkably varies. This results in unstable operations of the transistors.

The present invention has been made in consideration of the above problems, and it is accordingly an object of the present invention to provide a method and system for forming a stacked gate insulating film including a high quality thin silicon oxide film and a high dielectric film.

SUMMARY OF THE INVENTION

In order to achieve the above-described object, according to the first aspect of the present invention, there is provided a method for forming a stacked gate insulating film comprising a silicon oxide film and a dielectric film, which is stacked on the silicon oxide film and whose dielectric constant is higher than a dielectric constant of the silicon oxide film, the method comprising:

a heat oxidation process of heating a semiconductor wafer, and heat-oxidizing a surface of the semiconductor wafer, thereby to form a silicon oxide film on the semiconductor wafer, an etch back process of etching back the silicon oxide film so as to make the silicon oxide film thin; and a dielectric film formation process of forming the dielectric film on the thin silicon oxide film.

According to this invention, after the silicon oxide film is formed as a result of the heat oxidation process, the film is etched back so as to be formed thin. Thus, there is no need to form a silicon oxide film at a low temperature. After the high quality silicon oxide film whose interface trap density is low is formed at a high temperature, the silicon oxide film can be formed thin after etched back. In this structure, it is also possible that a variation in the threshold voltage of to-be-finally formed transistors is controlled. Further, a high dielectric film is stacked on the thin silicon oxide film, achieving a reduction in leakage current.

It is preferable that a temperature at which the heat oxidation process is carried out is equal to or higher than 800° C. Because the heat oxidation process is performed at a temperature equal to or higher than 800° C., the high quality silicon oxide film whose interface trap density is low can be obtained. In addition, the silicon oxide film is etched back, thereby the film can be formed thin while maintaining the high quality thereof.

It is preferable that the heat oxidation process includes a process of forming the silicon oxide film in such a way that a value of an interface trap density is equal to or smaller than $5 \times 10^{10}/cm^2$ eV. In the structure where the interface trap density of the silicon oxide film is low, the threshold value of to-be-formed MOS transistors can be controlled. In order to set the interface trap density at that value, it is effective that the heat oxidation process is performed at a temperature equal to or higher than 800° C., as explained above.

The heat oxidation process may include a process of forming the silicon oxide film to a thickness which larger than 20 angstrom, thereby forming the silicon oxide film at a high temperature. This prevents lowering the quality of the silicon oxide film. Even if the thickness of the silicon oxide film is made small in the etch back process, the quality of the formed silicon oxide film does not become low.

The etch back process may include a process of etching back the silicon oxide film with hydrofluoric acid. In this case, the thickness of the thin silicon oxide film can be uniformly formed.

The etch back process may include a process of etching back the silicon oxide film with activated specifies wherein a mixed gas including fluorine, nitrogen and hydrogen is activated using plasma. In this case, the etching speed is not high, thus the thickness of the silicon oxide film can easily be controlled. Unlike a wet etching process, there is no need to perform processes of cleaning and drying the thin silicon oxide film.

The dielectric film may be a tantalum oxide film or a zirconium oxide film. In this structure, a stacked gate insulating film whose dielectric constant is high can be formed.

According to the second aspect of the present invention, there is provided a system for forming a stacked gate insulating film, comprising:

a heat treatment apparatus which forms a silicon oxide film by heat-oxidizing a semiconductor wafer;

an etching apparatus which etches back the silicon oxide film so as to make the silicon oxide film thin; and a dielectric film formation apparatus which forms the dielectric film which is stacked on the thin silicon oxide film and whose dielectric constant is higher than a dielectric constant of the silicon oxide film.

In this structure, the semiconductor wafer is heat-oxidized by the heat treatment apparatus, and a silicon oxide film is formed thereon. The silicon oxide film is etched back by the etching apparatus, and is made thin. In doing this, the thin silicon oxide film is formed on the surface of the semiconductor wafer. A dielectric film whose dielectric constant is higher than that of the silicon oxide film is formed by the dielectric film formation apparatus, thereby forming a stacked gate insulating film whose dielectric constant is high.

The system for forming a stacked gate insulating film may included a multi-chamber system. The heat treatment apparatus, the etching apparatus and the dielectric film formation apparatus may be prepared respectively inside chambers of the multi-chamber system.

In this structure, the stacked gate insulating film can automatically and continuously be formed.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS (First Embodiment)

The first embodiment of the present invention will now be explained with reference to the accompanying drawings FIGS. 1 to 5.

Figure 1:
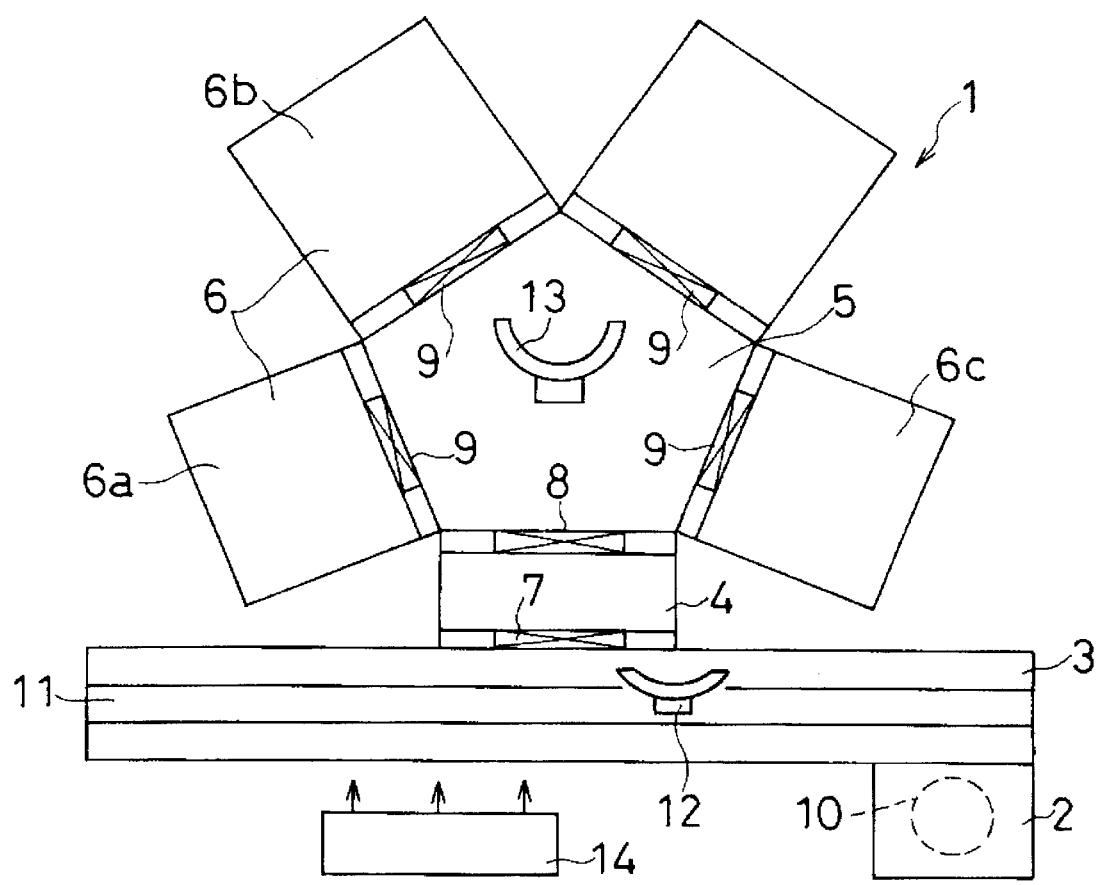
FIG. 1 is an exemplary diagram of a multi-chamber system according to the first embodiment of the present invention.

FIG. 1 illustrates, in the form of an exemplary diagram, a multi-chamber system employed for a technique of forming a stacked gate insulating film according to the first embodiment of the present invention.

As illustrated in FIG. 1, a multi-chamber system 1 comprises an input/output chamber 2, a first transport chamber 3, a load lock chamber 4, a second transport chamber 5 and a plurality of (in this embodiment, four of) chambers 6.

The input/output chamber 2 is a chamber for conveying a semiconductor wafer into or from the multi-chamber system 1. The load lock chamber 4 interconnects the first transport chamber 3 with the second transport chamber 5, and is a chamber for conveying the semiconductor wafer into or from the first transport chamber 3 or the second transport chamber 5. The first transport chamber 3 interconnects the input/output chamber 2 and the load lock chamber 4, whereas the second transport chamber 5 interconnects the load lock chamber 4 and each of the chambers 6.

The plurality of chambers 6 include various processors which are respectively suitable for objects to be manufactured using the multi-chamber system 1. In this embodiment, more specifically, the plurality of chambers 6 include a heat treatment apparatus 6a forming a silicon oxide film on a semiconductor wafer, an etching apparatus 6b etching the silicon oxide film formed on the semiconductor wafer, a CVD apparatus 6c forming a dielectric film on the silicon oxide film formed on the semiconductor wafer, and the like.

There is retained a vacuum in each of the second transport chamber 5 and each chamber 6 by a non-illustrative vacuum controller including a vacuum pump, valve, etc. The load lock chamber 4 has the structure wherein pressure can be controlled by the vacuum controller so that a vacuum or the atmospheric pressure is switched one from the other. The first transport chamber 3 and the load lock chamber 4 are connected to each other through a gate 7, and the load lock chamber 4 and the second transport chamber 5 are connected to each other through a gate 8. The second transport chamber 5 and each of the chambers 6 are connected to each other through a gate 9.

A semiconductor wafer 10 conveyed to the input/output apparatus 2 is transported into the first transport chamber 3 by a first transport arm 12 arranged along a transport rail 11 in the first transport chamber 3, and is transported to the load lock chamber 4 through the gate 7. The semiconductor wafer 10 transported into the load lock chamber 4 is transported into the second transport chamber 5 by a second transport arm 13, and transported into each of the chambers 6 through the gate 9.

A controller including a micro-processor, etc. controls whether each of the gates 7, 8 and 9 should be open or closed, and the movement of the first transport arm 12 and the second transport arm 13.

Figure 2:
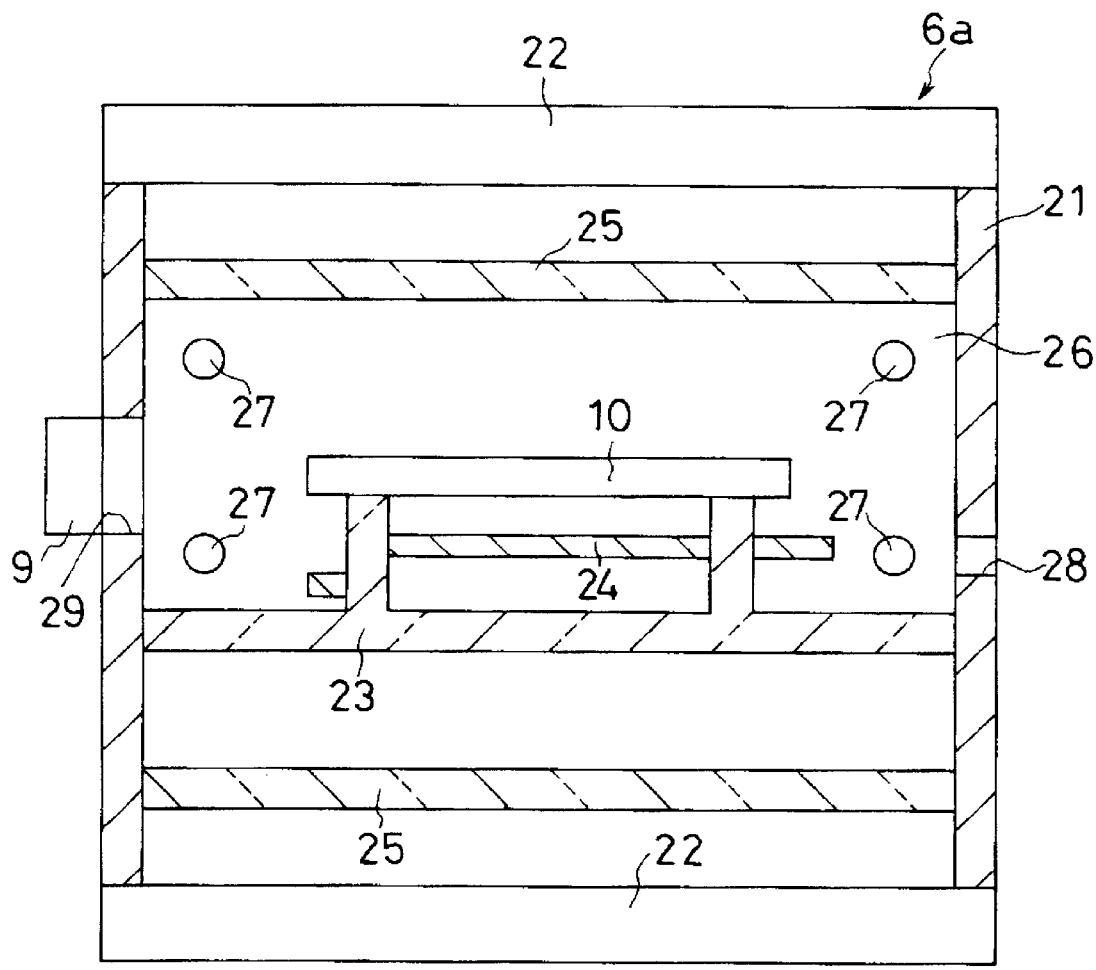
FIG. 2 is an exemplary diagram of a heat treatment apparatus according to the first embodiment.

FIG. 2 depicts an exemplary diagram of the heat treatment apparatus 6a formed as one of the plurality of chambers 6. The heat treatment apparatus 6a is used for a process of forming a silicon oxide film on a semiconductor wafer.

As illustrated in FIG. 2, a processing container 21 included in the heat treatment apparatus 6a is formed in a schematically cylinder-like shape. Heating lamps 22 are respectively formed at the upper and lower ends of the processing container 21. The heating lamps 22 include halogen lamps, for example.

A supporting member 23 which supports the semiconductor wafer 10 is arranged inside the processing container 21. The supporting member 23 is formed of transparent heat-resistant materials, such as, quartz or the like. A guide ring 24 is arranged in the supporting member 23 so as to prevent any unsteadiness movement of the supporting member 23.

Two quartz plates 25 are horizontally arranged between the two heating lamps 22 in such a way that the supporting member 23 is sandwiched by one of them arranged above and the other arranged below the supporting member 23. The space formed with the two quartz plates 25 and the side walls of the processing containers 21 is a processing space 26 wherein the semiconductor wafer 10 is subjected to a heat oxidation treatment. The heat rays emitted from the heating lamps 22 enter the processing space 26 through the quartz plates 25, resulting in that the processing space 26 (the processing container 21) is heated at a predetermined temperature of, for example, 800° C. to 1100° C.

A plurality of, for example, four of, processing gas inlet holes 27 for introducing processing gas into the processing space 26 are arranged on the side wall of the processing container 21. A processing gas providing system is connected to the processing gas inlet holes 27. In this structure, a predetermined amount of the processing gas is introduced into the processing space 26 by the processing gas providing system.

Provided on the side wall of the processing container 21 is a vent 28 for exhausting a gas inside the processing space 26. Connected to the vent 28 is a vent system including a vacuum pump, etc., and activating the vacuum pump can achieve setting of the pressure inside the processing container 21 at a predetermined pressure level.

Further provided on the side wall of the processing container 21 is an input/output section 29 for conveying the semiconductor wafer 10 into the processing container 21 (the processing space 26). The input/output section 29 is connected to the gate 9. Thus, the semiconductor wafer 10 transported by the second transport arm 13 is arranged on the supporting member 23 inside the processing container 21 via the input/output section 29.

With such a heat treatment apparatus 6a, in a state where the processing space 26 is heated at a predetermined temperature, and where the semiconductor wafer 10 is arranged on the supporting member 23 and the processing gas is introduced into the processing space 26 from the processing gas inlet holes 27, the surface of the semiconductor wafer 10 is heat-oxidized. If this heat oxidation treatment is carried out for, for example, 3 to 5 minutes or so, a silicon oxide film of, for example, 20 to 100 angstrom is formed on the surface of the semiconductor wafer 10.

Figure 3:
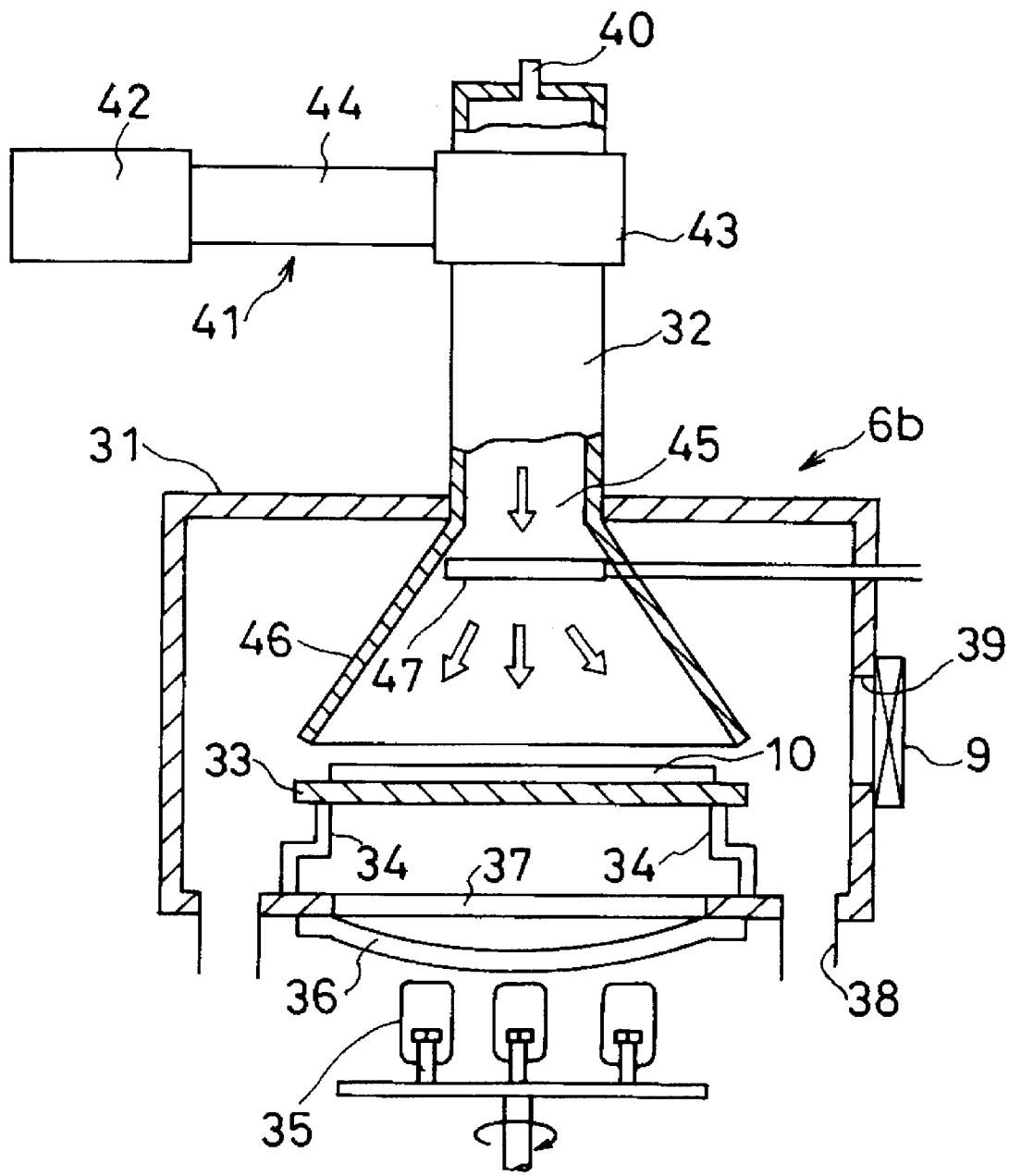
FIG. 3 is an exemplary diagram of an etching apparatus according to the first embodiment.

FIG. 3 is an exemplary diagram of the etching apparatus 6b arranged as one of the chambers 6. The etching apparatus 6b is used for a process of etching the silicon oxide film formed on the semiconductor wafer 10.

As described in FIG. 3, the etching apparatus 6b includes a processing container 31 which contains the semiconductor wafer 10, and a plasma formation tube 32 for activating gaseous nitrogen and gaseous hydrogen.

The processing container 31 is formed in a cylindrical shape with, for example, aluminum. Arranged inside the processing container 31 is a setting stand 33 on which the semiconductor wafer 10 is placed. The setting stand 33 is supported by a support 34, which is made of quartz, etc., and which is formed on the bottom surface of the processing container 31.

Heating lamps 35 heating the inside of the processing container 31 at a predetermined temperature are arranged underneath the processing container 31. A transparent window 36 which is made of quartz and formed in an arc-like shape in cross section is arranged between the processing container 31 and the heating lamps 35. Both ends of the transparent window 36 are airtightly connected under the bottom surface of the processing container 31. An irradiation section 37 is formed in a position facing the transparent window 36 under the bottom surface of the processing container 31. Those heat rays emitted from the heating lamps 35 enter the inside of the processing container 31 (the back surface of the setting stand 33) passing through the transparent window 36 and the irradiation section 37.

Arranged at the bottom of the processing container 31 are vents 38 each of which is connected to an exhaustion system including a vacuum pump, etc. Activating the vacuum pump can achieve setting of the pressure inside the processing container 31 at a predetermined pressure level.

Arranged on the side wall of the processing container 31 is an input/output section 39 for conveying the semiconductor wafer 10 into the processing container 31 through the gate 9. The input/output section 39 is connected to the gate 9. Thus, the semiconductor wafer 10 conveyed by the second transport arm 13 is set on the setting stand 33 inside the processing container 31 through the gate 9 and the input/output section 39.

The plasma formation tube 32 is formed in a tube-like shape with quartz, and is so arranged as to penetrate through the ceiling wall of the processing container 31.

A plasma gas inlet hole 40 prepared for introducing a plasma gas including gaseous nitrogen and gaseous hydrogen into the plasma formation tube 32 is arranged at the upper end of the plasma formation tube 32. The plasma gas inlet hole 40 is connected to a non-illustrative plasma gas supplying system. In this structure, a predetermined amount of plasma gas is conducted into the processing container 31 by the plasma supplying system through the plasma formation tube 32.

A plasma formation section 41 is formed at the upper section of the plasma formation tube 32. The plasma formation section 41 comprises a microwave generation source 42 which generates microwaves at, for example, 2.45 GHz, and a wave-guide 43 of, for example, Evenson type. The plasma formation section 41 supplies the microwaves generated by the microwave generation source 42 into the waveguide 43 and the plasma formation tube 32 through a rectangular waveguide 44, for example, thereby to activate the mixture of the gaseous nitrogen and the gaseous hydrogen.

A covering member 46 which is spread out downward in, for example, a conical shape, is formed at an outflow section 45 at the lower end of the plasma formation tube 32. The covering member 46 is formed in such a way that gases are efficiently conducted onto the semiconductor wafer 10.

Formed right underneath the outflow section 45 is a shower head 47 including a plurality of gas holes. The shower head 47 is connected to a non-illustrative nitrogen fluoride gas supplying system. In this structure, a predetermined amount of nitrogen fluoride gas is conducted into the processing container 31 by the nitrogen fluoride gas supplying system.

With such an etching apparatus 6b, the activated gaseous nitrogen, the activated gaseous hydrogen and the nitrogen fluoride gas are conducted onto the semiconductor wafer 10 on which the silicon oxide film is formed, resulting in forming a protection film by the effect of a chemical reaction of the activated gas and the silicon oxide film. Thereafter, if thus formed protection film is heated so as to be removed therefrom, the silicon oxide film is etched back to, for example, a 5 to 20 angstrom thickness.

Figure 4:
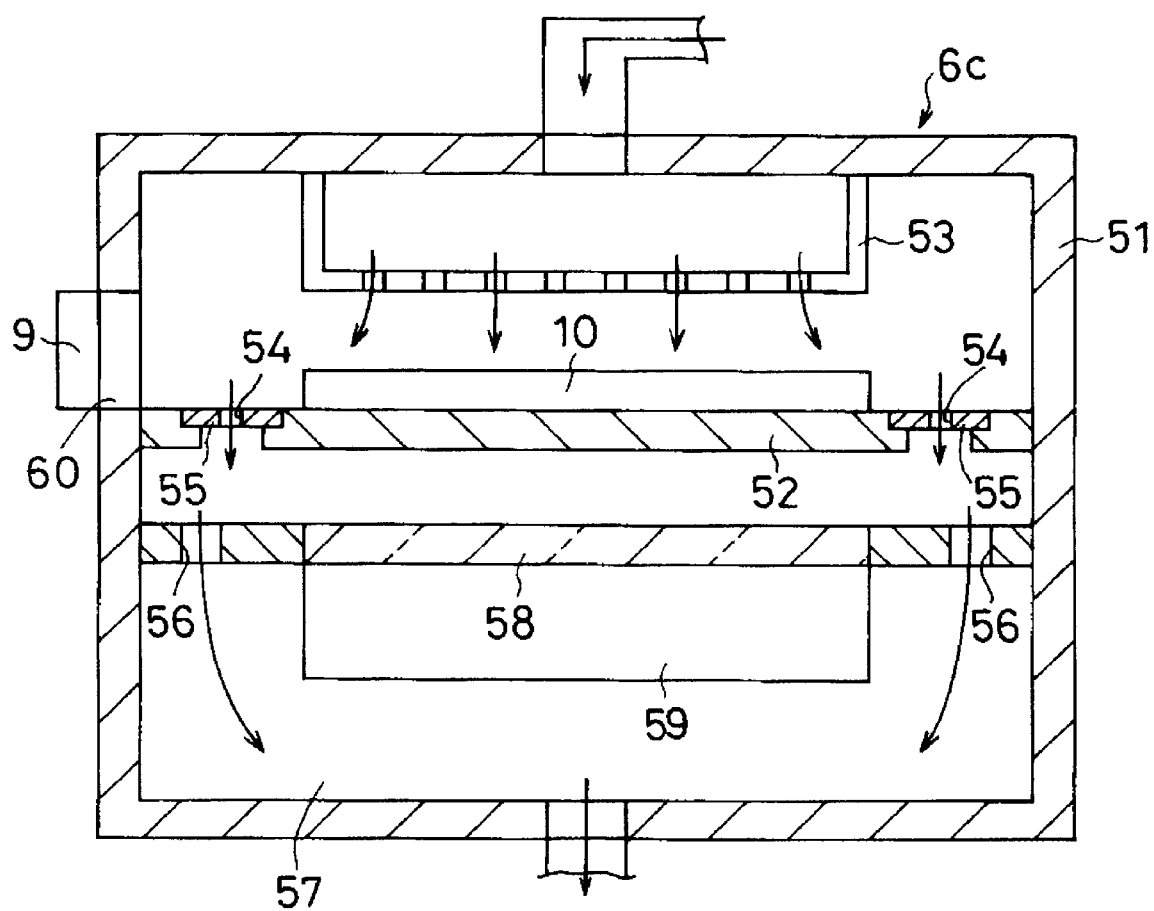
FIG. 4 is an exemplary diagram of a CVD apparatus according to the first embodiment.

FIG. 4 shows an exemplary diagram of the CVD apparatus 6c formed as one of the chambers 6. The CVD apparatus 6c is used for a process of forming a dielectric film on the thin silicon oxide film.

As illustrated in FIG. 4, arranged inside a processing container 51 of the CVD apparatus 6C is a susceptor 52 which supports the semiconductor wafer 10.

A shower head 53 is arranged in a position facing the upper surface of the susceptor 52 included in the processing container 51. The shower head 53 is connected to a nonillustrative processing gas supplying system. The processing gas supplied from the processing gas supplying system is conducted onto the susceptor 52 (the semiconductor wafer 10) inside the processing container 51 through the shower head 53.

Arranged on the periphery of the susceptor 52 are baffle plates 55 each including a plurality of baffle holes. Exhaust ports 56 for exhausting gases from the processing container 51 are formed respectively in four positions on the lower part of the processing container 51, and are connected to a buffer tank 57. In this structure where the shower head 53, the baffle holes 54 and the buffer tank 57 are included in the processing container 51, the variation in the pressure inside the processing container 51 can be reduced. Furthermore, the processing gas supplied from the shower head 53 can be constantly and evenly conducted onto the entire surface of the semiconductor wafer 10. The buffer tank 57 is connected a non-illustrative exhaust system including a vacuum pump, etc. Activating the vacuum pump can achieve setting of the pressure inside the processing container 51 at a predetermined pressure level.

A quartz window 58 is arranged in a position facing the lower surface of the susceptor 52 included in the processing container 51. Arranged underneath the lower surface of the quartz window 58 is a heating lamp 59 heating the inside of the processing container 51 between, for example, 300° C. and 600° C.

An input/output section 60 for conveying the semiconductor wafer 10 transported through the gate 9 into the processing container 51 is arranged on the side wall of the processing container 51. The input/output section 60 is connected to the gate 9. In this structure, thus, the semiconductor wafer 10 transported by the second transport arm 13 is held by the susceptor 52 in the processing container 51 through the gate 9 and the input/output section 60.

With such a CVD apparatus 6c, in a case where to form, for example, a tantalum oxide film on the silicon oxide film, the pressure inside the processing container 51 is retained at a pressure level of, for example, 1 to 10 Torr, and the processing gas is conducted into the processing container 51 wherein the temperature is raised to, for example, 300° C. to 600° C. by the heating lamp 59. The processing gas is composed of organic tantalum gas which has been heated up to a temperature of, for example, 100° C. to 200° C., and an inert gas as a carrier gas, for example, like an argon gas. Having performed this heat treatment for about 10 minutes or so, a tantalum oxide film having a thickness of, for example, a 10 to 100 angstrom is formed on the silicon oxide film.

Explanations will now be made to a method for forming a stacked gate insulating film on the semiconductor wafer 10 using the multi-chamber system 1 having the above-described structure. FIGS. 5A to 5D each shows an exemplary diagram of a stacked gate insulating film in each formation process. The below-described processes (operations) are controlled by a controller 14, and each carried out under the control of the controller 14.

Figure 5A:
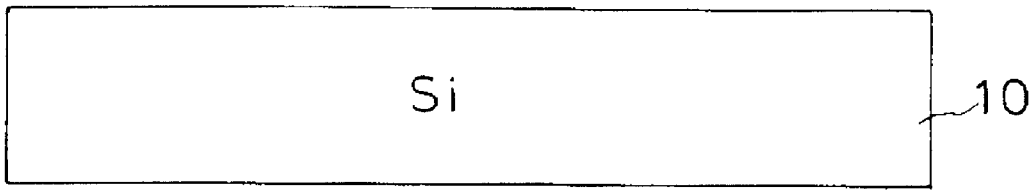
FIGS. 5A to 5D are exemplary diagrams each showing a stacked gate insulating film in a formation process according to the first embodiment.

After the semiconductor wafer 10 is conveyed into the input/output chamber 2 depicted in FIG. 5A, the semiconductor wafer 10 is transported into the first transport chamber 3 using the first transport arm 12, and contained in the load lock chamber 4 through the gate 7. Once the semiconductor wafer 10 is contained in the load lock chamber 4, the gate 7 is closed, and the load lock chamber 4 is airtight, retaining a vacuum inside the load lock chamber 4 by a non-illustrative vacuum controller. Then, the semiconductor wafer 10 is transported into the second transport chamber 5 through the gate 8 by the second transport arm 13, and is placed on the supporting member 23 inside the heat treatment apparatus 6a through the gate 9 and an input/output section 29.

Figure 5B:
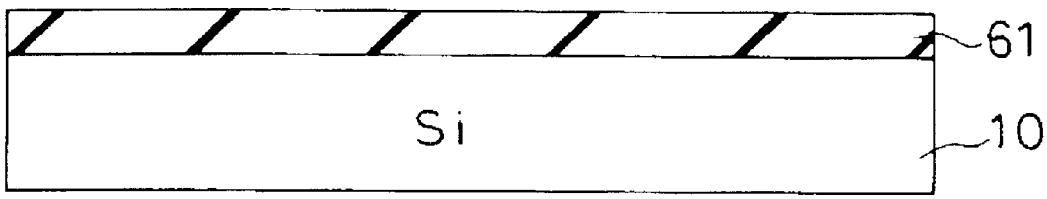
Figure 5C:
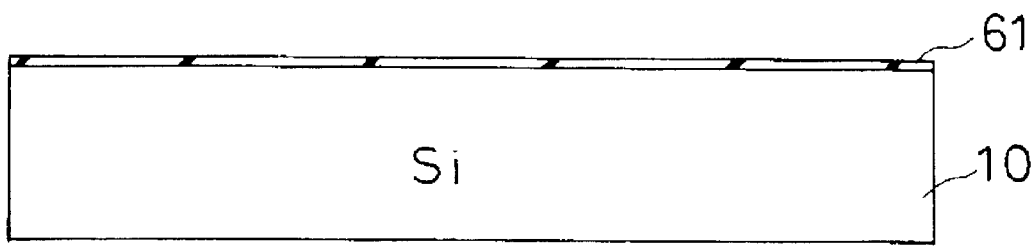

After the semiconductor wafer 10 is placed on the supporting member 23, the input/output section 29 is closed, the processing container 21 (the processing space 26) is airtight, and a non-illustrative exhaust system is activated, thereby to set the pressure inside the processing container 21 at a predetermined pressure level (a predetermined degree of vacuum). The inside of the processing container 21 is heated to a temperature of 850° C. by the heating lamp 22. After the vapor is conducted into the processing container 21 from the gas inlet holes 27, heat treatment is carried out therein for 4 minutes or so, thereby the surface of the semiconductor wafer 10 is heat-oxidized. Then, as illustrated in FIG. 5B, a silicon oxide film having a thickness of approximately 30 angstrom is formed on the semiconductor wafer 10 (heat oxidation process).

Upon completion of the heat oxidation process, the input/output section 29 and the gate 9 are open, and the semiconductor wafer 10 is transported into the second transport chamber 5 through the input/output section 29 and the gate 9, and then the semiconductor wafer 10 is placed on the setting stand 33 in the etching apparatus 6b through the gate 9 and the input/output section 39.

After the semiconductor wafer 10 is placed on the setting stand 33, the input/output section 39 is closed, the processing container 31 is airtight, and a non-illustrative exhaust system is activated, thereby to set the pressure inside the processing container 31 at a pressure level of, for example, 3 Torr. Then, a predetermined amount of, for example, 100 sccm, gaseous nitrogen and a predetermined amount of, for example, 10 sccm, gaseous hydrogen are introduced into the plasma formation tube 32 from the plasma gas inlet hole 40. At the same time, microwaves are generated at, for example, 2.45 GHz from the microwave generation source 42, and supplied into the plasma formation tube 32 through the rectangular waveguide 44 and the waveguide 43, thereby to activate the mixture of the gaseous nitrogen and the gaseous hydrogen. A predetermined amount, for example, 30 sccm, of nitrogen fluoride gas is conducted from the shower head 47 to the outflow section 45 at the lower end of the plasma formation tube 32, thereby to activate the nitrogen fluoride gas, as well. Thereafter, a chemical reaction of the activated gas nuclei and the silicon oxide film 61 formed on the semiconductor wafer 10 occurs, resulting in forming a protection film. The conducting of the gaseous nitrogen and the conducting of the gaseous hydrogen from the plasma gas inlet hole 40 are ended, and the conducting of the nitrogen fluoride gas from the shower head 47 is also ended. Further, the activation of the microwave generation source 42 is ended. By activating the non-illustrative exhaust system, any gas remaining inside the processing container 31 is removed therefrom, and the semiconductor wafer 10 is heated up to a temperature of, for example, 100° C. or higher by the heating lamp 35. Having thus heated the semiconductor wafer 10, the protection film is sublimated (the silicon oxide film 61 is etched back), and etched to a thickness of approximately 10 angstrom, as described in FIG. 5C (etch back process).

Upon completion of the etching back the silicon oxide film 61, the input/output section 39 and the gate 9 are open, the semiconductor wafer 10 is transported into the second transport chamber 5 by the second transport arm 13 through the input/output section 39 and the gate 9, and placed on the susceptor 52 in the CVD apparatus 6c, through the gate 9 and the input/output section 60.

Figure 5D:
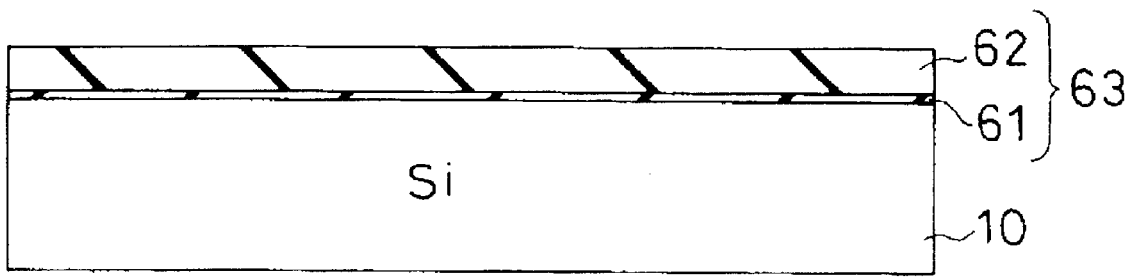

After the semiconductor wafer 10 is placed on the susceptor 52, the input/output section 60 is closed, the processing container 51 is airtight, and the non-illustrative exhaust system is activated, thereby to set the pressure inside the processing container 51 at a pressure level of 1 Torr. In addition, the inside of the processing container 51 is heated up to a temperature of, for example, 500° C. by the heating lamp 59. A pentaethoxy tantalum gas (Ta $(OC_2H_5)_5$,) which has been heated at a temperature of 170° C. and vaporized, an argon gas, an oxidizing gas and gaseous nitrogen including moist are all conducted into the processing container 51, and a heat treatment is performed for 10 minutes or so. At this time, the shower head 53, the buffle holes 54, the buffer tank 57 and the like are arranged inside the processing container 51, therefore, the variation in the pressure inside the processing container 51 is low. Thus, the processing gas supplied from the shower head 53 can almost evenly be conducted onto the entire surface of the semiconductor wafer 10. As illustrated in FIG. 5D, a tantalum oxide film ($Ta_2O_5$) having a thickness of approximately 50 angstrom is formed on the silicon oxide film 61 (dielectric film formation process). Accordingly, a stacked gate insulating film 63 including the silicon oxide film 61 and a tantalum oxide film 62 is formed on the semiconductor wafer 10.

The semiconductor wafer 10 on which the stacked gate insulating film 63 is formed is transported into the second transport chamber 5 by the second transport arm 13 via the input/output section 60 and the gate 9, and contained in the load lock chamber 4 via the gate 8. Further, the semiconductor wafer 10 is transported into the first transport chamber 3 and then into the input/output chamber 2 by the first transport arm 12 via the gate 7.

Once the stacked gate insulating film 63 is formed in accordance with the above described manner, the silicon oxide film 61 forming the stacked gate insulating film 63 can be made approximately 10 angstrom in thickness.

In order to check the quality of the silicon oxide film 61, the interface trap density of this silicon oxide film 61 is measured. The interface trap density is one indication for evaluating the quality of the silicon oxide film 61. It is preferred that the calculated value be equal to or lower than $5 \times 10^{10}/cm^2$ eV. In the case where the value is higher than $5 \times 10^{10}/cm^2$ eV, the variation in a threshold voltage becomes high, resulting in that the operations of the transistors may be unstable. The interface trap density of the silicon oxide film 61 in this embodiment is approximately $4.3 \times 10^{10}/cm^2$ eV, implying the high quality of the silicon oxide film 61.

The interface trap density of the silicon oxide film 61, which is formed at a variety of heat treatment temperatures, is measured for a number of times, under the condition that the heat treatment temperature in each heat oxidation process is changed from that in the heat treatment process described in the above-described embodiment. According to this measurement, it is estimated that the heat treatment temperature should be equal to or higher than 800° C., in order that the interface trap density of the silicon oxide film 61 is to be equal to or lower than $5 \times 10^{10}/cm^2$ eV. It is therefore suggested that if the heat treatment temperature is equal to or higher than 800° C., the silicon oxide film 61 without any defectiveness can be formed.

In addition, in the case where the heat treatment temperature in each heat oxidation process is equal to or higher than 800° C., the evenness and the thickness (how much the thickness deviates from a desired thickness) of the surface of the silicon oxide film 61 formed on the semiconductor wafer 10 are studied during a variety of heat oxidation processes respectively with a variety of heat treatment periods. As a result of this, in a heat oxidation process, it is estimated that a nearly-desired thickness of the silicon oxide film 61 can be obtained, when the silicon oxide film 61 is made equal to or thicker than 20 angstrom in thickness. Accordingly, it is preferred that, in each heat oxidation process, the silicon oxide film 61 be formed equal to or thicker than 20 angstrom in thickness.

Furthermore, it is examined how thin the silicon oxide film 61 formed in a heat oxidation process can be formed in an etch back process. According to this examination, it is possible that the silicon oxide film 61 having a thickness of, for example, 3 angstrom or so is formed using the etching apparatus 6b in the etch back process. However, if the silicon oxide film 61 is formed to have a thickness smaller than 5 angstrom, the silicon oxide film 61 may electrically be conducted. Therefore, it is preferred that the silicon oxide film 61 be etched to a thickness of 5 to 20 angstrom in the etch back process.

As explained above, according to this embodiment, the semiconductor wafer 10 is heat-oxidized at a high temperature. By this heat oxidation, a high quality silicon oxide film 61 is formed, and then etched back. This enables to form the high quality silicon oxide film 61 which is quite thin. The tantalum oxide film 62 is formed on the silicon oxide film 61, resulting in forming the stacked gate insulating film 63 having a high dielectric constant. Accordingly, the thickness of the stacked gate insulating film 63 can be made large, while the thickness of the silicon oxide film 61 is made small, thereby to prevent a current from flowing to the stacked gate insulating film 63.

In the case where the thickness of the silicon oxide film 61 is, for example, 10 angstrom, as being thinner than 20 angstrom, the silicon oxide film 61 having the thickness which does not deviate from a desired thickness and the surface having preferable evenness.

(Second Embodiment)

In the first embodiment, the explanations have been made to the case where the system for forming the stacked gate insulating film is the multi-chamber system. However, the present invention is not limited to the above, and can be adapted for any other system wherein the formation of the stacked gate insulating film is continuously carried out. Hence, each of the apparatuses mounted in the system may be of a batch processing type. In addition, one of the apparatuses in the system may be a wet etching apparatus which is hard to be mounted in the multi-chamber system.

The second embodiment of the present invention will now be described, wherein a batch type apparatus is employed as a heat treatment apparatus and a wet etching apparatus is employed as an etching apparatus. The CVD apparatus 6c, as described in the first embodiment, is also employed as a dielectric film formation apparatus in the second embodiment.

Figure 6:
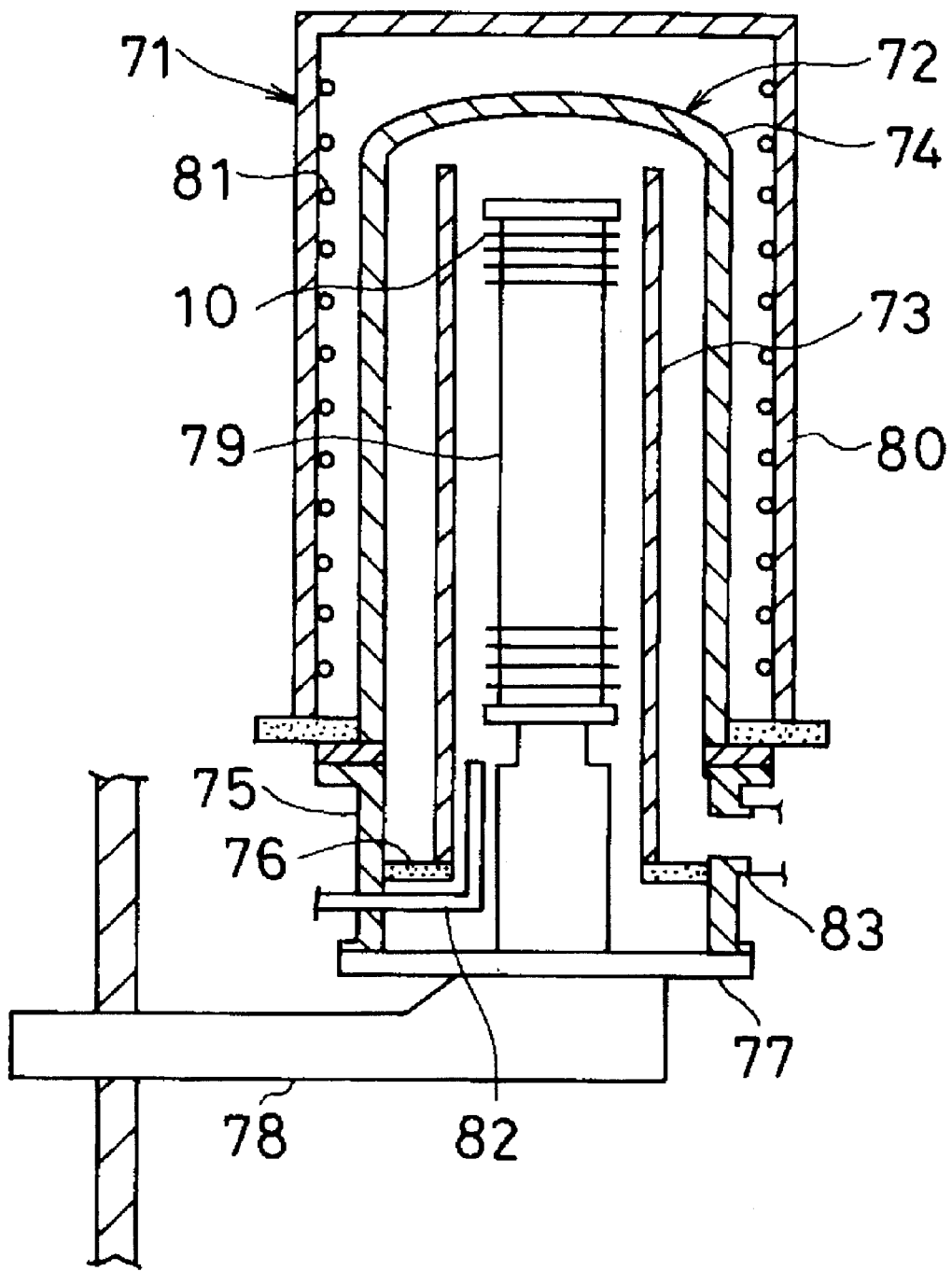
FIG. 6 is an exemplary diagram of a heat treatment apparatus according to the second embodiment of the present invention.

FIG. 6 illustrates a schematic diagram of a heat treatment apparatus 71. As described in FIG. 6, the heat treatment apparatus 71 includes a cylindrical reaction tube 72 having a longitudinal axis which is vertically oriented. The reaction tube 72 has the double tube structure having an inner tube 73 and an outer tube 74, which has the ceiling and is so formed with a predetermined space as to cover the inner tube 73. The inner tube 73 and the outer tube 74 are formed of a heat-resistant material, such as quartz or the like.

Arranged on the lower portion of the inner tube 73 and the outer tube 74 is a manifold 75 which is formed of metal in a cylindrical shape. The manifold 75 is airtightly connected to the lower end of the outer tube 74. The inner tube 73 is supported by a supporting ring 76 which is projected from the inner wall of the manifold 75.

A lid 77 is arranged underneath the manifold 75, and can be moved upward and downward. The lid 77 is moved upward by a boat elevator 78 so as to close the lower end of the manifold 75.

Placed on the lid 77 is a wafer boat 79 formed of, for example, quartz. The wafer boat 79 contains a plurality of target objects to be heat-treated, for example, semiconductor wafers 10 which are vertically oriented at given intervals.

Arranged on the circumferential section of the reaction tube 72 is an insulator 80 which is formed as to cover the reaction tube 72. A heater 81 including, for example, a resistance heater is arranged on the inner surface of the insulator 80. The inside of the reaction tube 72 is heated up to a predetermined temperature in a range between, for example, 800° C. and 1100° C. by the heater 81.

A plurality of gas inlet tubes 82 penetrate through the manifold 75, and are bent upward the manifold 75. It should be noted that FIG. 6 depicts only one of the plurality of gas inlet tubes 82 by way of example. The gas inlet tube 82 is inserted into the manifold 75 in a position underneath the supporting ring 76, and allows processing gas, for example, vapor to be conducted into the inner tube 73.

An outlet 83 is arranged on the side wall of the manifold 75. The outlet 83 is formed in a position above the supporting ring 76, and reaches a space formed between the inner tube 73 and the outer tube 74 within the reaction tube 72. The outlet 83 is connected to a non-illustrative exhaust system including a vacuum pump, or the like. The pressure inside the reaction tube 72 is set at a predetermined pressure level by activating the vacuum pump.

In the state where the inside of the reaction tube 72 is heated up to a predetermined temperature using the heat treatment apparatus 71 and the wafer boat 79 containing the semiconductor wafers 10 is loaded into the reaction tube 72, the processing gas is conducted into the reaction tube 72 from the gas inlet tube 82, resulting in the surfaces of the semiconductor wafers 10 to be heat-oxidized. If this heat oxidation process is carried out for 3 to 5 minutes or so, a silicon oxide film having a thickness of 20 to 100 angstrom is formed on each surface of each of the semiconductor wafers 10.

Figure 7:
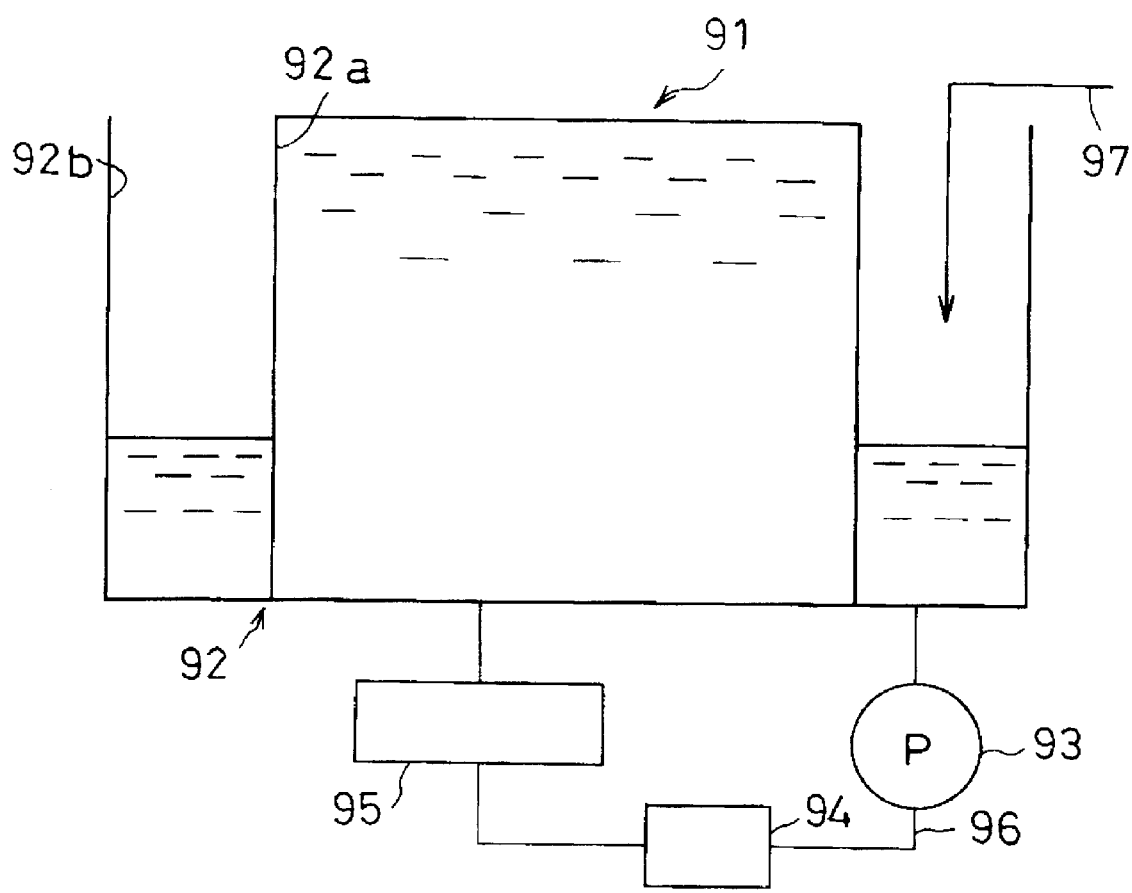
FIG. 7 is an exemplary diagram of an etching apparatus according to the second embodiment.
Figure 8:
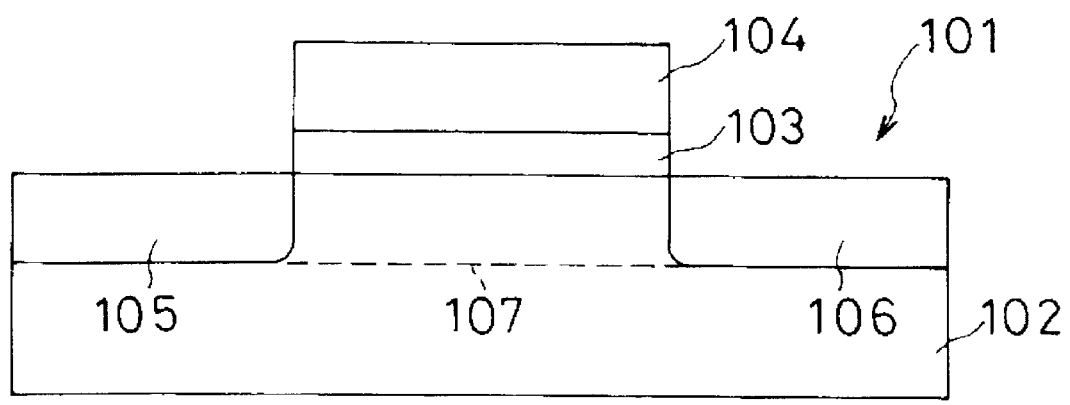
FIG. 8 is an exemplary diagram showing a MOSFET.

FIG. 7 shows an exemplary diagram of an etching apparatus 91. As shown in FIG. 7, the etching apparatus 91 comprises an etching processing tank 92, a circulation pump 93, a filter 94 and a temperature controlling mechanism 95.

The etching processing tank 92 includes a processing tank 92a which is filled with etching processing fluid, for example, hydrofluoric acid, and a collection tank 92b, which is formed as to surround the processing tank 92a, and for collecting the etching processing fluid overflowing from the processing tank 92a.

Connected to the lower end of the collection tank 92b is one end of a pipe 96 the other end of which is connected to the lower end of the processing tank 92a. Arranged on the pipe 96 is the circulation pump 93 for conducting the etching processing fluid from the collection tank 92b into the pipe 96 and supplying the etching processing fluid into the processing tank 92a. In this structure, thus, after the etching processing fluid which overflows from the processing tank 92a is collected in the collection tank 92b, the etching processing fluid is supplied back to the processing tank 92a through the circulation pump 93.

Arranged on the downstream side of the circulation pump 93 on the pipe 96 is the filter 94 for collecting those particles included in the etching processing fluid. Arranged on the downstream side of the filter 94 on the pipe 96 is the temperature controlling mechanism 95 for controlling the temperature of the etching processing fluid to a temperature of, for example, 20° C.

The collection tank 92b is connected to a processing fluid supply line 97 for supplying etching processing fluid, thereby retaining the state where the processing tank 92a is replenished with the etching processing fluid. Then, the silicon oxide film formed on the surface of the semiconductor wafer is dipped into the etching processing fluid, thereby to etch back the silicon oxide film to a thickness of 5 to 20 angstrom or so.

Explanations will now be made to a method for forming a stacked gate insulating film on each semiconductor wafer 10, while continuously performing a series of the formation processes using the heat treatment apparatus 71, the etching apparatus 91 and the CVD apparatus 6c respectively having the above-described structures. Each of the formation processes (operations) is controlled by a non-illustrative controller, and carried out in accordance with the control of the controller.

The inside of the reaction tube 72 is heated up to a temperature of 850° C. by the heater 81. When the temperature inside the reaction tube 72 reaches 850° C., the semiconductor wafer 10 described in FIG. 5A is contained in the wafer boat 79, the lid 77 is moved upward by the boat elevator 78, and the wafer boat 79 (the semiconductor wafer 10) is loaded into the reaction tube 72 (the inner tube 73). Then, a non-illustrative exhaust system is activated, thereby to set the pressure inside the reaction tube 72 at a predetermined pressure level. Vapor is conducted from the gas inlet tube 82 into the inner tube 73 so as to perform a heat treatment process for about 4 minutes or so. This results in the surface of each semiconductor wafer 10 to be heat-oxidized. By doing so, as illustrated in FIG. 5B, the silicon oxide film 61 having a thickness of approximately 30 angstrom is formed on each semiconductor wafer 10 (heat oxidation process).

Upon completion of the heat oxidation process, the lid 77 is moved downward by the boat elevator 78, in order to unload the wafer boat 79 (the semiconductor wafer 10) from the reaction tube 72. After this, the semiconductor wafer 10 on which the silicon oxide film 61 is formed is transported to the etching apparatus 91 by, for example, a non-illustrative operational arm so as to be etched back.

The semiconductor wafer 10 transported to the etching apparatus 91 is retained by the non-illustrative operational arm in a state where the surface on which the silicon oxide film 61 is formed faces downward. The silicon oxide film 61 formed on the surface of the semiconductor wafer 10 is dipped into the processing tank 92a which is filled with hydrofluoric acid so as to be etched back. For example, as described in FIG. 5C, the silicon oxide film 61 is etched to a thickness of approximately 10 angstrom (etch back process). The semiconductor wafer 10 a part of which has been etched back is transported to a non-illustrative cleaning apparatus and a non-illustrative drying apparatus so as to remove any hydrofluoric acid remaining on the silicon oxide film 61.

The semiconductor wafer 10 with the silicon oxide film 61 is placed on the susceptor 52, and, as illustrated in FIG. 5D, the tantalum oxide film ($Ta_2O_5$) 62 having a thickness of approximately 50 angstrom is formed on the silicon oxide film 61 (dielectric film formation process). Accordingly, the stacked gate insulating film 63 including the silicon oxide film 61 and the tantalum oxide film 62 is formed on the semiconductor wafer 10.

Finally, the semiconductor wafer 10 on which the tacked gate insulating film 63 is formed is released externally from the CVD apparatus 7C.

In this embodiment, the batch-processing type heat treatment apparatus is employed as the heat treatment apparatus 71. Therefore, it is possible that a plurality of silicon oxide films 61 are respectively formed on a plurality of semiconductor wafers 10 at once.

The silicon oxide film 61 is etched using a wet etch back technique with hydrofluoric acid, therefore, the uniform thickness of the etched silicon oxide film 61 can be made.

The present invention is not limited to the above-described embodiments. For example, the dielectric film may be formed of any material having a higher dielectric constant than that of the silicon oxide film. Thus, a zirconium oxide film ($ZrO_2$, $ZrSiO_x$), for example, may be employed as the dielectric film.

The etching apparatus 91 according to the second embodiment is not limited to the apparatus having the structure wherein the semiconductor wafer is dipped into the hydrofluoric acid. Hence, the etching apparatus 91 may have the structure for spraying hydrofluoric acid onto the semiconductor wafer. The etching processing fluid is not limited to hydrofluoric acid, and may be a mixture of, for example, ammonium fluoride, hydrofluoric acid and hydrofluoric acid ammonium aqueous solution.

The dry etching process is not limited to that described in the first embodiment, and may be performed using anhylrous hydrofluoric acid. In this case also, those apparatus for cleaning and drying the semiconductor wafer 10 are not necessary, thus the etching apparatus can easily be mounted in the multi-chamber system 1.

According to the present invention, in order to achieve an increase in chemical stability of the contact surface of the silicon oxide film 61 and the tantalum oxide film 62, after the silicon oxide film 61 is etched back, the surface of the silicon oxide film 61 may possibly be nitrided. The silicon oxide film 61 may be replaced with an oxynitride film.

The oxidation processing, the etching processing and the dielectric film formation processing, according to the present invention, may be carried out respectively using a vertical furnace, a wet station and a batch (or a single wafer) CVD apparatus, in accordance with a process flow excluding any clustering step.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-263548 filed on Sep. 17, 1999, and including specification, claims, drawings and summary. The disclosure of the above Japanese Patent Application is incorporated herein by reference in its entirety.

What is claimed is:

1. A method for forming a stacked gate insulating film comprising a silicon oxide film and a dielectric film, which is stacked on the silicon oxide film and whose dielectric constant is higher than a dielectric constant of the silicon oxide film, said method comprising:

a heat oxidation process of heating a semiconductor wafer, and heat-oxidizing a surface of the semiconductor wafer, thereby to form a silicon oxide film on the semiconductor wafer;

an etch back process of etching back the silicon oxide film that is formed by the heat oxidation process so as to make the silicon oxide film thin;

a dielectric film formation process of forming the dielectric film on the thin silicon oxide film;

said heat oxidation process includes a process of forming the silicon oxide film to a thickness which larger than 20 angstrom; and said etch back process includes a process of etching the silicon oxide film to a thickness which is equal to or smaller than 20 angstrom.

2. The method for forming a stacked gate insulating film according to claim 1, wherein:

a temperature at which said heat oxidation process is carried out is equal to or higher than 800° C.

3. The method for forming a stacked gate insulating film according to claim 1, wherein.

said heat oxidation process includes a process for forming the silicon oxide film in such a way that a value of an interface trap density is equal to or smaller than $5 \times 10^{10}/cm^2$ eV.

4. The method for forming a stacked gate insulating film according to claim 2, wherein:

said heat oxidation process includes a process for forming the silicon oxide film in such a way that a value of an interface trap density is equal to or smaller than $5 \times 10^{10}/cm^2$ eV.

5. The method for forming a stacked gate insulating film according to claim 1, wherein said etch back process includes a process of etching back the silicon oxide film with hydrofluoric acid.

6. The method for forming a stacked gate insulating film according to claim 2, wherein said etch back process includes a process of etching back the silicon oxide film with hydrofluoric acid.

7. The method for forming a stacked gate insulating film according to claim 3, wherein said etch back process includes a process of etching back the silicon oxide film with hydrofluoric acid.

8. The method for forming a stacked gate insulating film according to claim 4, wherein said etch back process includes a process of etching back the silicon oxide film with hydrofluoric acid.

9. The method for forming a stacked gate insulating film according to claim 1, wherein said etch back process includes a process of etching back the silicon oxide film with activated gaseous mixtures including at least one of: fluorine, nitrogen and hydrogen.

10. The method for forming a stacked gate insulating film according to claim 2, wherein said etch back process includes a process of etching back the silicon oxide film with activated gaseous mixtures including at least one of: fluorine, nitrogen and hydrogen.

11. The method for forming a stacked gate insulating film according to claim 3, wherein said etch back process includes a process of etching back the silicon oxide film with activated gaseous mixtures including at least one of: fluorine, nitrogen and hydrogen.

12. The method for forming a stacked gate insulating film according to claim 4, wherein said etch back process includes a process of etching back the silicon oxide film with activated gaseous mixtures including at least one of: fluorine, nitrogen and hydrogen.

13. The method for forming a stacked gate insulating film according to claim 1, wherein the dielectric film is a tantalum oxide film or a zirconium oxide film.

14. The method for forming a stacked gate insulating film according to claim 2, wherein the dielectric film is a tantalum oxide film or a zirconium oxide film.

* * * * *

UNITED STATES PATENT AND TRADEMARK OFFICE
CERTIFICATE OF CORRECTION

PATENT NO.   : 6,617,207 B1
DATED        : September 9, 2003
INVENTOR(S)  : Kiryu et al.

It is certified that error appears in the above-identified patent and that said Letters Patent is hereby corrected as shown below:

<u>Title page,</u>
Insert item:
-- [*] Notice:  Subject to any disclaimer, the term of this patent is extended or adjusted under 35 U.S.C. 154(b) by 282 days. --

Signed and Sealed this

Sixth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,617,207 B1
DATED : September 9, 2003
INVENTOR(S) : Kiryu et al.

It is certified that error appears in the above-identified patent and that said Letters Patent is hereby corrected as shown below:

Column 14,
Line 23, "which larger" should read -- which is larger --.

Signed and Sealed this

Twenty-fourth Day of January, 2006

JON W. DUDAS
*Director of the United States Patent and Trademark Office*